US012801015B2

(12) United States Patent
Hakone et al.

(10) Patent No.: US 12,801,015 B2
(45) Date of Patent: Nov. 17, 2026

(54) PHOTOSENSITIVE RESIN COMPOSITION AND CURED PRODUCT THEREFROM

(71) Applicant: Nippon Kayaku Kabushiki Kaisha, Tokyo (JP)

(72) Inventors: Yoshihiro Hakone, Tokyo (JP); Taihei Koumoto, Tokyo (JP)

(73) Assignee: NIPPON KAYAKU KABUSHIKI KAISHA, Tokyo (JP)

( * ) Notice: Subject to any disclaimer, the term of this patent is extended or adjusted under 35 U.S.C. 154(b) by 887 days.

(21) Appl. No.: 16/605,330

(22) PCT Filed: Apr. 20, 2018

(86) PCT No.: PCT/JP2018/016265
§ 371 (c)(1),
(2) Date: Oct. 15, 2019

(87) PCT Pub. No.: WO2018/194154
PCT Pub. Date: Oct. 25, 2018

(65) Prior Publication Data

US 2021/0124265 A1 Apr. 29, 2021

(30) Foreign Application Priority Data

Apr. 21, 2017 (JP) ................................ 2017-084274
Sep. 19, 2017 (JP) ................................ 2017-178459

(51) Int. Cl.
*G03F 7/038* (2006.01)
*C08G 59/22* (2006.01)
*G03F 7/004* (2006.01)

(52) U.S. Cl.
CPC ........... *G03F 7/0385* (2013.01); *C08G 59/22* (2013.01); *G03F 7/0045* (2013.01)

(58) Field of Classification Search
CPC ......... C08L 63/06; C08L 63/04; G03F 7/0045
See application file for complete search history.

(56) References Cited

U.S. PATENT DOCUMENTS 8,865,392 B2 10/2014 Donishi et al.
2005/0260522 A1* 11/2005 Weber ..................... G03F 7/038 430/280.1
2006/0257785 A1* 11/2006 Johnson ................ G03F 7/0385 430/280.1
2012/0295199 A1* 11/2012 Takeyama ............. C08G 59/38 528/367
2013/0108961 A1* 5/2013 Oonishi ................ G03F 7/0385 430/280.1
2013/0149645 A1* 6/2013 Takemura ............. G03F 7/0757 430/283.1
2014/0302430 A1* 10/2014 Nawrocki ............... C08L 63/00 430/18
2019/0235380 A1* 8/2019 Nakamura ............ G03F 7/0047

FOREIGN PATENT DOCUMENTS

JP 2000-122287 A 4/2000
JP 2002-161196 A 6/2002
JP 2007-506137 A 3/2007
TW 201223991 A 6/2012
TW 201337462 A 9/2013
WO 2005/029177 A1 3/2005
WO 2012/008472 A1 1/2012
WO WO-2013122208 A1 * 8/2013 ........... G03F 7/0233
WO WO-2018043395 A1 * 3/2018 ............... C08K 3/22

OTHER PUBLICATIONS

"TEPIC", visited Apr. 22, 2022, https://www.nissanchem.co.jp/pdf_db/tepicpdf, p. 1. (Year: 2022).*
"Epoxy Resin", visited Apr. 25, 2022, http://www.mcc-epoxy.jp/products/epoxy_jer.html, pp. 1-4 (Year: 2022).*
English translation of WO2013122208. (Year: 2013).*
Singaporean communication dated Apr. 19, 2021 in corresponding Singaporean patent application No. 11201909549V.
International Search Report and Written Opinion mailed Jul. 24, 2018 in corresponding PCT application No. PCT/JP2018/016265.
International Preliminary Report on Patentability issued Oct. 31, 2019 in corresponding PCT application No. PCT/JP2018/016265.
Taiwanese communication, with English translation, dated Jun. 29, 2021 in corresponding Taiwanese patent application No. 107113515.

* cited by examiner

*Primary Examiner* — Keith Walker
*Assistant Examiner* — Anna Malloy
(74) *Attorney, Agent, or Firm* — Nields, Lemack & Frame, LLC

(57) ABSTRACT

A negative acting photosensitive resin composition including (A) a compound having a triazine ring and represented by formula (1) (in formula (1), each $R_1$ independently represents an organic group, wherein at least one $R_1$ represents an organic group having a glycidyl group or an organic group having an oxetanyl group), (B) an epoxy resin having in each molecule a benzene backbone and at least two epoxy groups and having an epoxy equivalent weight of not more than 500 g/eq., and (C) a cationic photopolymerization initiator. The content of the (A) compound represented by formula (1) with reference to the (B) epoxy resin is 1 to 50 mass %. The (B) epoxy resin satisfies at least one of the following conditions (i) and (ii): condition (i) a weight-average molecular weight of at least 500, and condition (ii) a softening point of at least 40° C.:

(1)

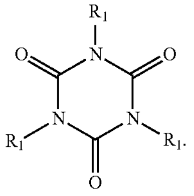

10 Claims, No Drawings

PHOTOSENSITIVE RESIN COMPOSITION AND CURED PRODUCT THEREFROM

TECHNICAL FIELD

The present invention relates to a negative-acting photosensitive resin composition having excellent resolution, which is useful in the manufacturing of MEMS (micro electro mechanical system) parts, micromachine parts, microfluid parts, μ-TAS (micro total analysis system) parts, inkjet printer parts, microreactor parts, conductive layers, LIGA parts, molds and stamps for micro injection molding and heat embossing, screens and stencils for fine printing applications, MEMS package parts, semiconductor package parts, BioMEMS and bio-photonic devices, and printed wiring boards. The present invention further relates to a cured product of the negative-acting photosensitive resin composition having a high elastic modulus at high temperatures and also having excellent adhesion to various substrates.

BACKGROUND ART

Recently, photolithographically processable resists have been widely used in semiconductor and MEMS-micromachine applications. In such applications, the photolithography processing is achieved by performing patterning exposure on a substrate, followed by development with a liquid developer to selectively remove exposed regions or unexposed regions. Photolithographically processable resists (photoresists) include positive and negative types. The exposed part dissolves in a liquid developer in the case of a positive type and is insoluble therein in the case of a negative type. In the leading-edge electropackage applications and MEMS applications, not only the capability of forming a uniform spin coating film, but also a high aspect ratio, a straight sidewall shape in a thick film, high adhesion to substrates, and the like are demanded. Here, an aspect ratio is an important property that indicates the performance of photolithography, which is calculated from the resist film thickness/pattern line width.

As such a photoresist, a negative-type chemically amplified photoresist composition containing a polyfunctional bisphenol A novolac type epoxy resin (trade name: EPON SU-8 Resin, manufactured by Resolution Performance Products LLC) and a cationic photopolymerization initiator such as CYRACURE UVI-6974 manufactured by Dow Chemical (this cationic photopolymerization initiator is composed of a propylene carbonate solution of an aromatic sulfonium hexafluoroantimonate) is known. This photoresist composition has extremely low light absorption in a wavelength range of 350 to 450 nm, and thus is known as a photoresist composition that can be processed by thick-film photolithography. When this photoresist composition is applied onto various substrates by spin coating, curtain coating, or the like, and baked to volatilize the solvent, a solid photoresist layer having a thickness of 100 μm or more can be formed. Further, when this solid photoresist layer is irradiated with near-UV light through a photomask by an exposure method such as contact exposure, proximity exposure, or projection exposure, the layer can be photolithographically processed. Subsequently, the substrate is immersed in a liquid developer to dissolve the unexposed regions, Whereby a high-resolution negative image of the photomask can be formed on the substrate.

In the case where a cured product of a photoresist is used as a part of a semiconductor package or the like, for example, when the semiconductor package production includes plastic encapsulation of the photoresist cured product together with other parts, the cured product is required to have a high elastic modulus at high temperatures such that its shape can be maintained even during the plastic encapsulation.

In addition, conventionally, as substrates for MEMS parts, MEMS packages, semiconductor packages, and the like, not only silicon wafers that have been generally used, but also various substrates, such as silicon nitride and lithium tantalate, for example, are sometimes used depending on the intended use. Therefore, a cured product of a photoresist is also required to have excellent adhesion to these substrates.

Patent Literature 1 discloses a photosensitive resin composition containing a cationic photopolymerization initiator having a specified structure and a polyfunctional epoxy resin. In the examples of this literature, it is described that a cured product of the photosensitive resin composition had excellent adhesion to a silicon wafer. However, this literature nowhere mentions the elastic modulus at high temperatures and the adhesion to substrates other than silicon wafers.

CITATION LIST

Patent Literature

PATENT LITERATURE 1: JP-A1-WO2012/008472

SUMMARY OF INVENTION

Technical Problem

The present invention has been accomplished against the above background, and an object thereof is to provide a negative-acting photosensitive resin composition having excellent resolution, a cured product of which maintains a high elastic modulus even at high temperatures and also has excellent adhesion to various substrates other than silicon wafers.

Solution to Problem

The present inventors conducted intensive research. As a result, they have found that the above problem can be solved by a negative-acting photosensitive resin composition containing a compound having a triazine backbone having a specific structure, a polyfunctional epoxy resin having a benzene backbone and satisfying specific parameters, and a cationic photopolymerization initiator, and thus accomplished the present invention.

The present invention relates to the following modes.

[1].

A negative-acting photosensitive resin composition including:

(A) a compound having a triazine ring represented by the following formula (1)

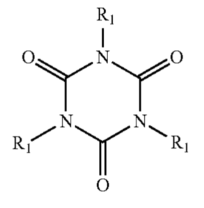

wherein $R_1$s each independently represent an organic group, with the proviso that at least one $R_1$ represents an organic group having a glycidyl group or an organic group having art oxetanyl group;

(B) an epoxy resin having a benzene backbone and at least two epoxy groups in one molecule and having an epoxy equivalent weight of 500 g/eq or less; and (C) a cationic photopolymerization initiator, the negative-acting photosensitive resin composition being configured such that the content of the compound (A) represented by formula (1) relative to the epoxy resin (B) is 1 to 50 mass %, and the epoxy resin (B) satisfies at least one of the following conditions (i) and (ii):

condition (i): having a weight-average molecular weight of 500 or more; and condition (ii): having a softening point of 40° C. or more.

[2].

The negative-acting photosensitive resin composition according to the above item [1], wherein at least one $R_1$ is an organic group represented by the following formula (1-1):

(1-1)

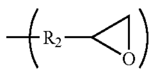

wherein $R_2$ represents a $C_{1-8}$ alkylene group, the following formula (1-2):

(1-2)

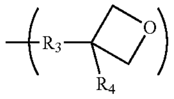

wherein $R_3$ represents a $C_{1-8}$ alkylene group, and $R_4$ represents a $C_{1-6}$ alkyl group, or the following formula (1-3):

(1-3)

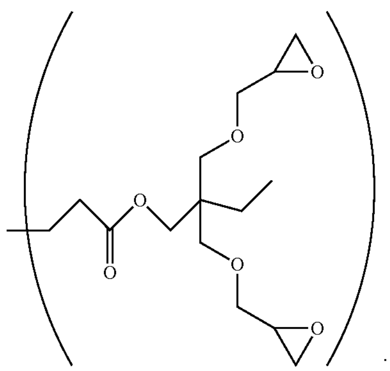

[3].

The negative-acting photosensitive resin composition according to the above item [2], wherein any of $R_1$s is an organic group represented by formula (1-1), an organic group represented by formula (1-2), or an organic group represented by formula (1-3).

[4].

The negative-acting photosensitive resin composition according to the above item [2], wherein at least one $R_1$ is an organic group represented by the following formula (1-4):

(1-4)

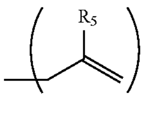

wherein $R_5$ represents a hydrogen atom or a methyl group.

[5].

The negative-acting photosensitive resin composition according to any one of the above items [1] to [4], wherein the epoxy resin (B) having a benzene backbone and at least two epoxy groups in one molecule and having an epoxy equivalent weight of 500 g/eq or less is at least one member selected from the group consisting of:

an epoxy resin (B-1) represented by the following formula (2):

(2)

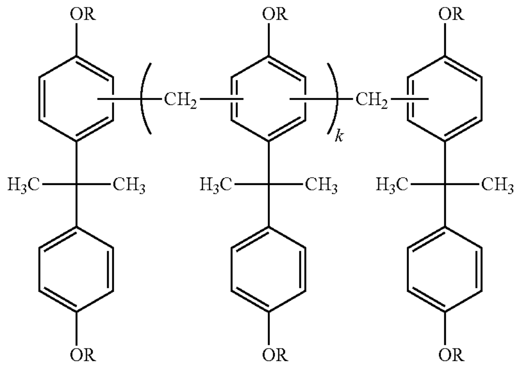

wherein Rs each independently represent a glycidyl group or a hydrogen atom, with the proviso that at least two Rs are glycidyl groups, and k represents an average and is a real number within a range of 0 to 30, an epoxy resin (B-2) represented by the following formula (3):

(3)

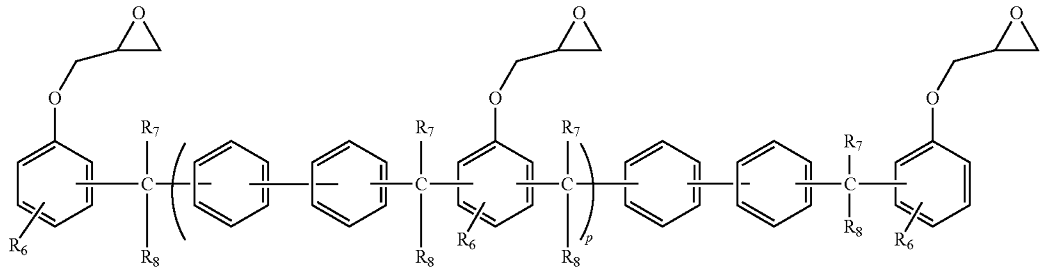

wherein $R_6$, $R_7$, and $R_8$ each independently represent a hydrogen atom or a $C_{1-4}$ alkyl group, and p represents an average and is a real number within a range of 1 to 30, an epoxy resin (B-3) represented by the following formula (4):

(4)

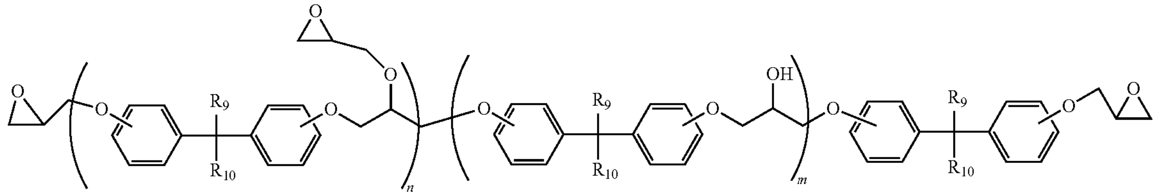

wherein n and m each represent an average, n is a real number within a range of 1 to 30, m is a real number within a range of 0.1 to 30, and $R_9$ and $R_{10}$ each independently represent a hydrogen atom, a $C_{1-4}$ alkyl group, or a trifluoromethyl group, an epoxy resin (B-4) represented by the following formula (5):

(5)

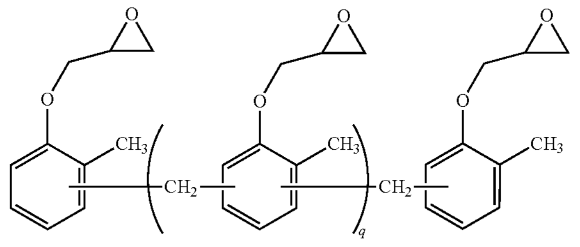

wherein q represents an average and is a real number within a range of 1 to 30, an epoxy resin (B-5) that is a reaction product between a phenol derivative represented by the following formula (6):

(6)

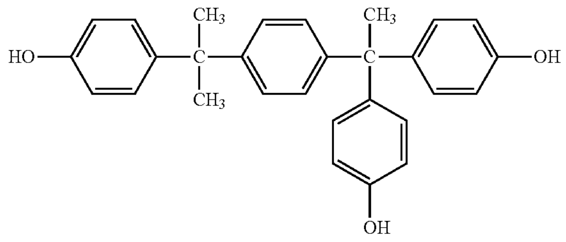

and an epihalohydrin, an epoxy resin (B-6) obtained by allowing a polybasic acid anhydride to react with a reaction product between an epoxy compound having at least two epoxy groups in one molecule and a compound having at least one hydroxyl group and one carboxyl group in one molecule, an epoxy resin (9-7) represented by the following formula (7):

(7)

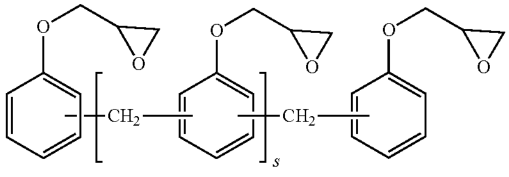

wherein s represents an average and is a real number within a range of 1 to 10, an epoxy resin (B-8) represented by the following formula (8):

(8)

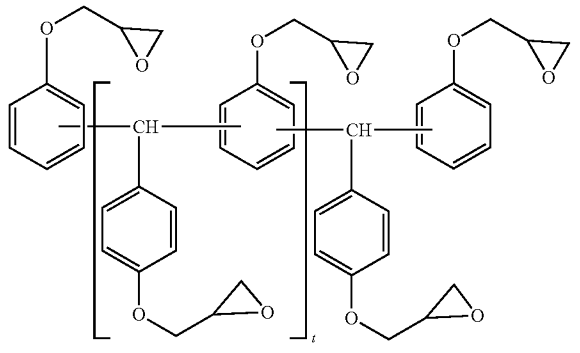

wherein t represents an average and is a real number within a range of 0.1 to 5, and an epoxy resin (B-9) represented by the following formula (9):

(9)

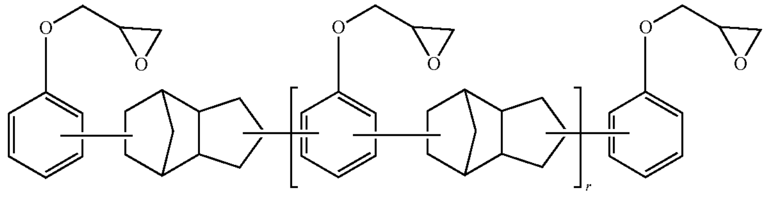

wherein r represents an average and is a real number within a range of 0.1 to 6.

[6].

A dry film resist including the negative-acting photosensitive resin composition according to any one of the above items [1] to [5].

[7].

A cured product of the negative-acting photosensitive resin composition according to any one of the above items [1] to [5] or the dry film resist according to the above item [6].

[8].

A wafer level package including the cured product according to the above item [7].

[9]

An adhesive layer between a substrate and an adherend, including the cured product according to the above item [7].

Advantageous Effects of Invention

The negative-acting photosensitive resin composition of the present invention has excellent resolution and is also highly effective in controlling the generation of residues after development, and a cured product thereof maintains a high elastic modulus even at high temperatures and also has excellent adhesion to various substrates other than silicon wafers. Therefore, this negative-acting photosensitive resin composition is suitable for use in MEMS parts, micromachine parts, semiconductor package parts, and the like.

DESCRIPTION OF EMBODIMENTS

Hereinafter, the present invention will be described.

The negative-acting photosensitive resin composition of the present invention contains (A) a compound having a triazine ring represented by the above formula (1) (hereinafter simply referred to as "component (A)").

In formula (1), $R_1$s each independently represent an organic group. The organic group represented by $R_1$ in formula (1) is not particularly limited as long as it does not inhibit the desired properties of the resin composition of the invention. For example, examples of organic groups represented by $R_1$ in formula (1) include functional groups such as a hydroxyl group, an aldehyde group, a carboxy group, a nitro group, an amino group, a sulfo group, and a cyano group, halogeno groups such as a bromine atom, a chlorine atom, a fluorine atom, and an iodine atom, and also residues obtained by removing one hydrogen atom from an aliphatic hydrocarbon compound, aromatic hydrocarbon compound, or heterocyclic compound optionally substituted with these groups.

However, at least one $R_1$ in formula (1) represents an organic group having a glycidyl group or an organic group having an oxetanyl group. That is, the compound having a triazine ring represented by formula (I) is a compound having at least one glycidyl group or oxetanyl group.

The organic group having a glycidyl group or an oxetanyl group represented by $R_1$ in formula (1) is not particularly limited as long as it has a glycidyl group or an oxetanyl group, but is preferably an organic group represented by the above formula (1-1), (1-2), or (1-3).

In formula (1-1), $R_2$ represents a $C_{1-8}$ alkylene group.

The $C_{1-8}$ alkylene group represented by $R_2$ in formula (1-1) is not limited to linear, branched, or cyclic as long as the number of carbon atoms is 1 to 8. The alkylene group represented by $R_2$ optionally has an alkyl group as a substituent. In the case where the alkylene group has an alkyl group as a substituent, the total of the number of carbon atoms in the alkylene group and the number of carbon atoms in the alkyl group may be 1 to 8.

The number of carbon atoms in the main chain of the alkylene group represented by formula (1-1) is preferably 1 to 6. Specific examples of $C_{1-6}$ alkylenes include a methylene group, an ethylene group, an n-propylene group, an n-butylene group, an n-pentylene group, an n-hexylene group, an isopropylene group, an isobutylene group, an isopentylene group, a neopentylene group, an isohexylene group, and a cyclohexylene group. In terms of the lithographic properties, adhesion, and heat resistance of the resulting cured product, a methylene group, an ethylene group, and an n-propylene group are preferable, and an n-propylene group is more preferable.

In formula (1-2), $R_3$ represents a $C_{1-8}$ alkylene group, and $R_4$ represents a $C_{1-6}$ alkyl group.

As $C_{1-8}$ alkylene groups represented by $R_3$ in formula (1-2), the same examples as for $C_{1-8}$ alkylene groups represented by $R_2$ in formula (1-1) can be mentioned, and preferred examples are also the same.

The $C_{1-6}$ alkyl group represented by $R_4$ in formula 1-2 is not limited to linear, branched, or cyclic as long as the number of carbon atoms is 1 to 6.

Examples of $C_{1-6}$ alkyl groups represented by $R_4$ in formula (1-2) include $C_{1-6}$ linear or branched alkyl groups and $C_{5-6}$ cyclic alkyl groups (a cyclopentyl group and cyclohexyl group). $R_4$ is preferably a $C_{1-6}$ linear or branched alkyl group. $R_4$ is more preferably a linear $C_{1-4}$ alkyl group, still more preferably a methyl group or an ethyl group, and particularly preferably an ethyl group.

In addition, as component (A), it is also preferable to use a compound having an organic group represented by the above formula (1-1), (1-2), or (I-3) and an organic group represented by formula (1-4) as $R_1$s. In formula (1-4), $R_5$ represents a hydrogen atom or a methyl group, and is preferably a hydrogen atom.

Compounds represented by formula (1) preferable as component (A) will be described hereinafter.

(i) A compound in which all $R_1$s are organic groups represented by formula 1-1) wherein $R_2$ is an n-propylene group.

(ii) A compound in which all $R_1$s are organic groups represented by formula (1-1) wherein $R_2$ is a methylene group.

(iii) A compound in which all $R_1$s are organic groups represented by formula (1-2) wherein $R_3$ is a methylene group, and $R_4$ is an ethyl group.

(iv) A compound in which all $R_1$s are organic groups represented by formula (1-3).

(v) A compound in which one $R_1$ is an organic group represented by formula (1) wherein each $R_1$ is independently represented by formula (1-3).

(vi) A compound in which two $R_1$s are organic groups represented by formula (1-1) wherein $R_2$ is a methylene group, and the remaining one $R_1$ is an organic group represented by formula (1-4) wherein $R_5$ is a hydrogen atom.

Compounds of component (A) are commercially available. Specific examples thereof include TEPIC series (manufactured by Nissan Chemical Industries) such as TEPIC (the above (ii)). TEPIC-VL (the above (i)). TEPIC-PAS (a mixture of the above (ii) and a modification product of the above (ii)), TEPIC-G TEPIC-S, TEPIC-SP, TEPIC-SS, TEPIC-HP, TEPIC-L, TEPIC-FL, and TEPIC-UC (the above (v)), and MA-DGIC (the above (iv)), DA-MGIC (the above (vi)), and TOIC (the above (iii)) (manufactured by Shikoku Chemicals Corporation).

The negative-acting photosensitive resin composition of the present invention contains (B) an epoxy resin having a benzene backbone and at least two epoxy groups in one molecule and having an epoxy equivalent weight of 500 g/eq or less, the epoxy resin having a weight-average molecular weight of 500 or more and/or a softening point of 40° C. or more (hereinafter simply referred to as "component (B)"). Examples of component (B) include long-chain bisphenol type epoxy resins such as a long-chain bisphenol A type epoxy resin and a long-chain bisphenol F type epoxy resin, novolac type epoxy resins obtained by allowing a novolac, which is obtained by the reaction between a phenol compound (e.g., phenol, an alkyl-substituted phenol, naphthol, an alkyl-substituted naphthol, dihydroxybenzene, dihydroxynaphthalene, etc.) and formaldehyde in the presence of an acidic catalyst, to react with a halohydrin such as epichlorohydrin or methylepichlorohydrin, and the like, where the epoxy equivalent weight, weight-average molecular weight, and softening point satisfy the above conditions. Component (B) is not limited to these examples as long as it is an epoxy resin whose epoxy equivalent weight, weight-average molecular weight, and softening point satisfy the above conditions, and is a polyfunctional epoxy resin having a benzene ring.

Specific examples of component (B) as illustrated above include KM-N-LCL, EOCN-1025, EOCN-1035, EOCN-1045, EOCN-1020, EOCN-4400H, EPPN-201, EPPN-501, EPPN-502, XD-1000, BREN-S, NER-7604, NER-7403, NER-1302, NER-7516, and NC-3000H (each trade name, manufactured by Nippon Kayaku Co., Ltd.), and EPIKOTE 157S70 (trade name, manufactured by Mitsubishi Chemical Corporation).

Among these examples of component (B), epoxy resins (B-1), (B-2), (B-3), (B-4), (B-5), (B-6), (B-7). (B-8), and (B-9) as mentioned above are preferable, because the chemical resistance, plasma resistance, and transparency of a cured product thereof are high, and further the cured product has low moisture absorption. (B-1), (B-2), and (B-3) are more preferable, and a mixture of (B-1), (B-2), and (B-3) is still more preferable.

Among these preferred examples of component (B), the epoxy resin (B-5) is a reaction product of a phenol derivative represented by the above formula (6) and an epihalohydrin.

As a common synthesis method for the epoxy resin (B-5), the following method can be mentioned, for example: an alkali, such as sodium hydroxide, is added to a mixed solution obtained by dissolving a phenol derivative represented by formula (6) and an epihalohydrin (epichlorohydrin, epibromohydrin, etc.) in a solvent capable of dissolving them, the mixture is heated to the reaction temperature to cause an addition reaction and a ring-closing reaction, then repeatedly the reaction mixture is washed with water and separated and the aqueous layer is removed, and finally the solvent is distilled off from the oil layer.

It is known that depending on the ratio between the phenol derivative represented by formula (6) and the epihalohydrin used in the synthesis reaction, an epoxy resin (B-5) containing a different major component can be obtained. For example, in the case where the epihalohydrin is used in excess relative to phenolic hydroxyl groups of the phenol derivative, the resulting epoxy resin (B-5) contains, as a major component, a trifunctional epoxy resin in which the three phenolic hydroxyl groups in formula (6) are all epoxidized. With a decrease in the amount of epihalohydrin used relative to phenolic hydroxyl groups, phenolic hydroxyl groups of a plurality of the phenol derivative are linked to each other through the epihalohydrin, and the content of a polyfunctional epoxy resin having a large weight-average molecular weight, in which the remaining phenolic hydroxyl groups are epoxidized, increases.

As a method for obtaining the epoxy resin (B-5) whose major component is such a polymeric (oligomeric) epoxy resin, in addition to the above method in which control is performed with the ratio between the phenol derivative and the epihalohydrin, a method in which the epoxy resin (B-5) once obtained is further allowed to react with a phenol derivative can also be mentioned. The epoxy resin (B-5) obtained by such a method is also encompassed within the scope of the epoxy resin (B-5) to be contained in the photosensitive resin composition of the present invention.

The reaction between a phenol derivative represented by formula (6) and an epihalohydrin is performed using the epihalohydrin in a proportion of usually 0.3 to 30 mol, preferably 1 to 20 mol, and more preferably 3 to 15 mol, per mole of the phenol derivative (equivalent to 3 mol of hydroxyl groups).

As the epoxy resin (13-5) contained in the resin composition of the present invention, as long as it is an epoxy resin obtained by the reaction between a phenol derivative represented by formula (6) and an epihalohydrin, the epoxy resin (B-5) whose major component is any of an epoxy resin that is a monomer of the phenol derivative or an epoxy resin that is a polymer of the phenol derivative can be used. Because the epoxy resin (B-5) has excellent solvent solubility and a low softening point and is easy to handle, the epoxy resin (B-5) whose major component is an epoxy resin that is a monomer of a phenol derivative, an epoxy resin that is a dimer of a phenol derivative (i.e., an epoxy resin having a structure in which two phenol derivatives represented by formula (6) are linked through an epihalohydrin), or an epoxy resin that is a trimer of a phenol derivative i.e., an epoxy resin having a structure in which three phenol derivatives represented by formula (6) are linked through an epihalohydrin) is preferable. The epoxy resin (B-5) whose major component is an epoxy resin that is a monomer of a phenol derivative or an epoxy resin that is a dimer of a phenol derivative is more preferable.

The specific structure of the epoxy resin (B-5) that is a monomer of a phenol derivative represented by formula (6) is shown below in formula (6-1).

(6-1)

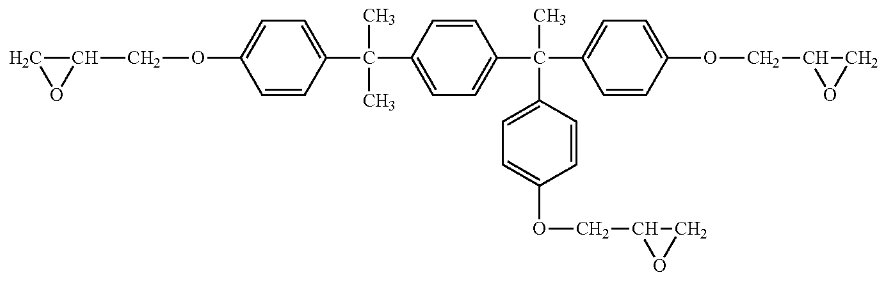

The specific structure of the epoxy resin (B-5) that is a dimer of a phenol derivative represented by formula (6) is shown below in formula (6-2).

(6-2)

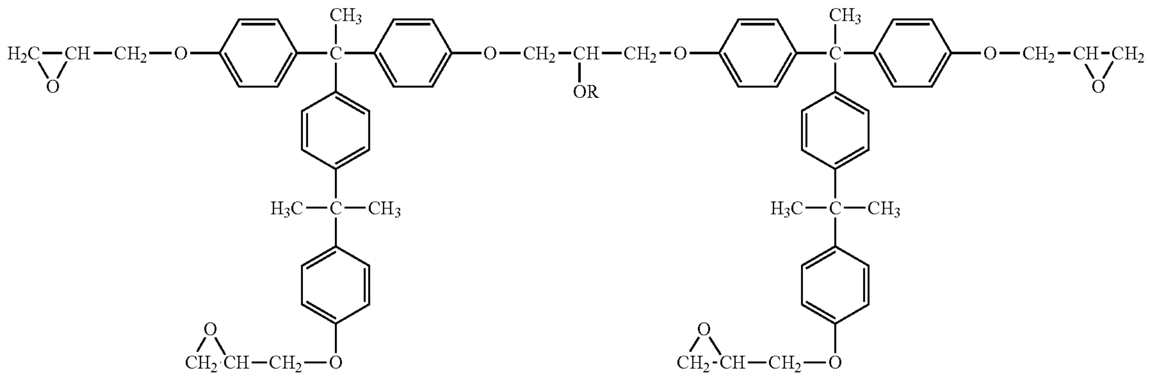

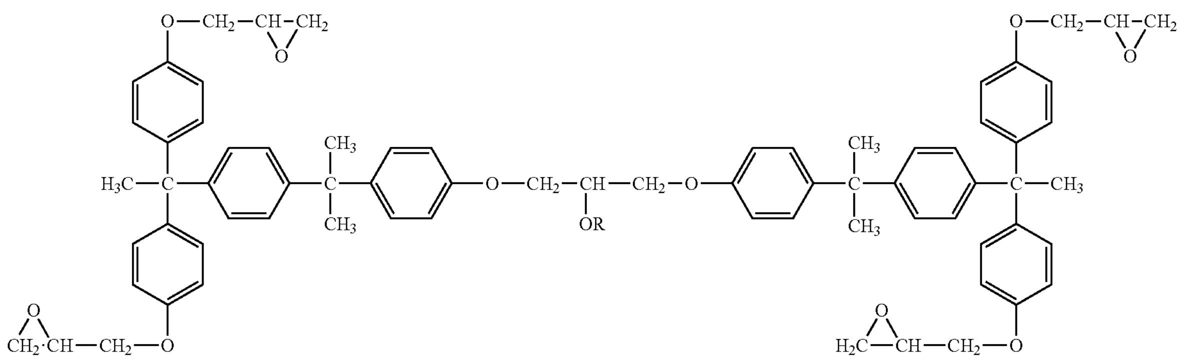

-continued
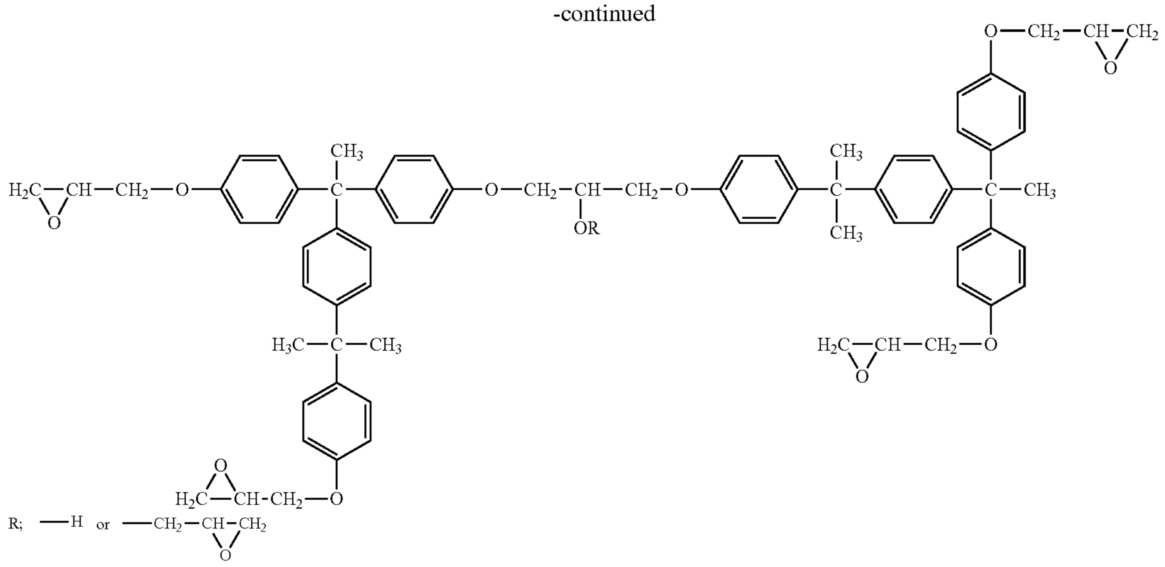
The specific structure of the epoxy resin (B-5) that is a trimer of a phenol derivative represented by formula (6) is shown below in formula (6-3).

(6-3)
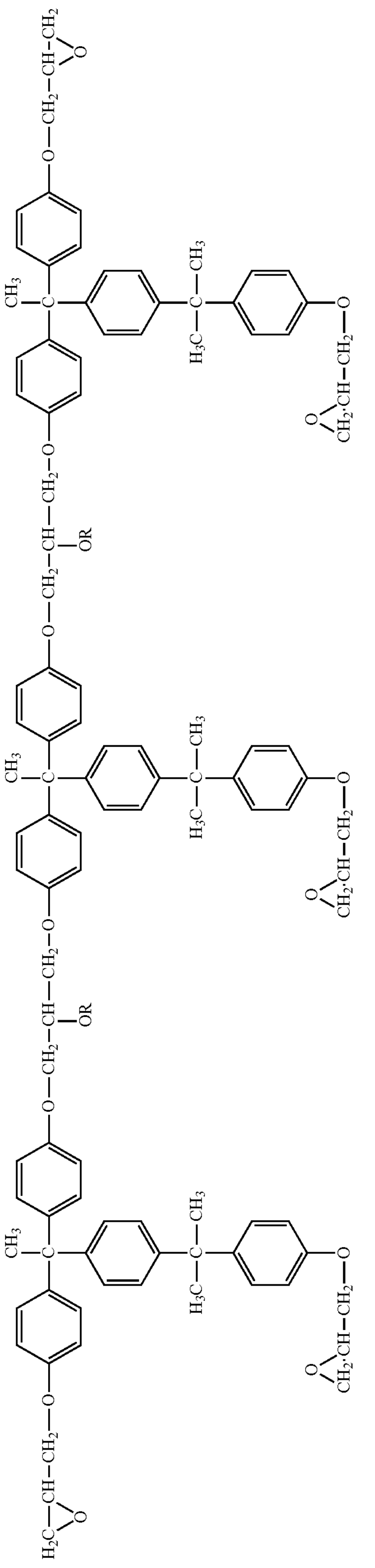

-continued
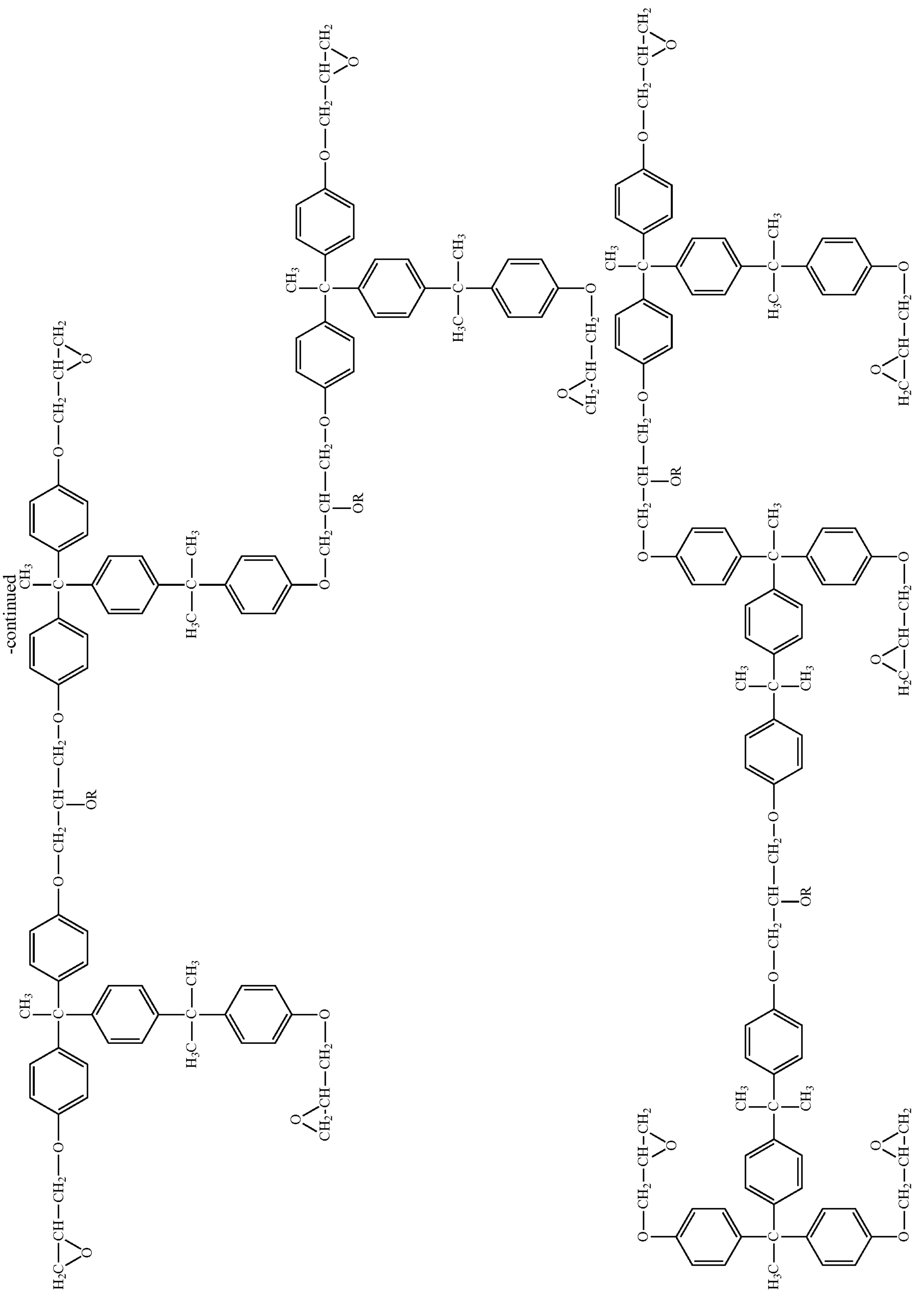

-continued
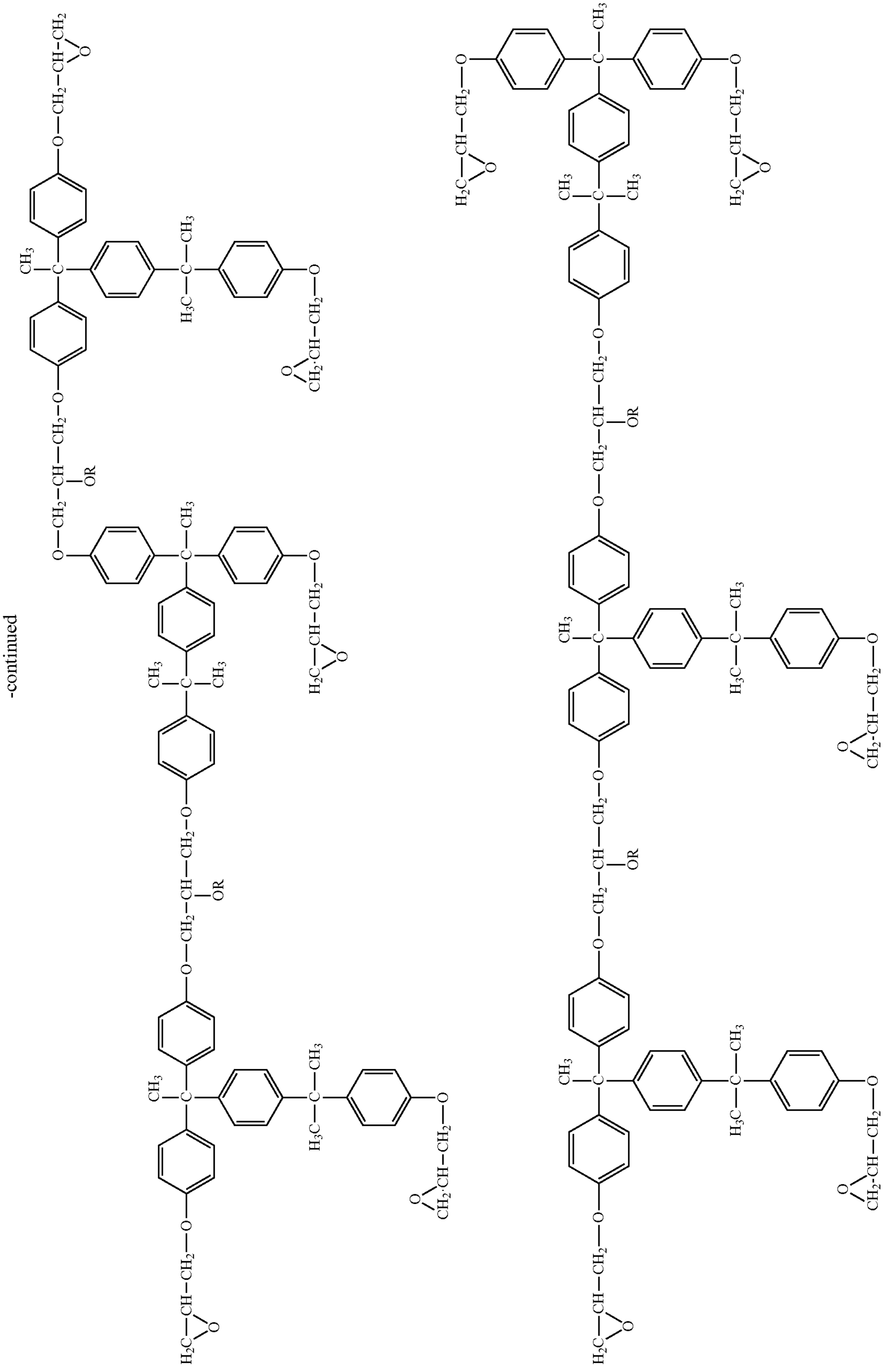

-continued
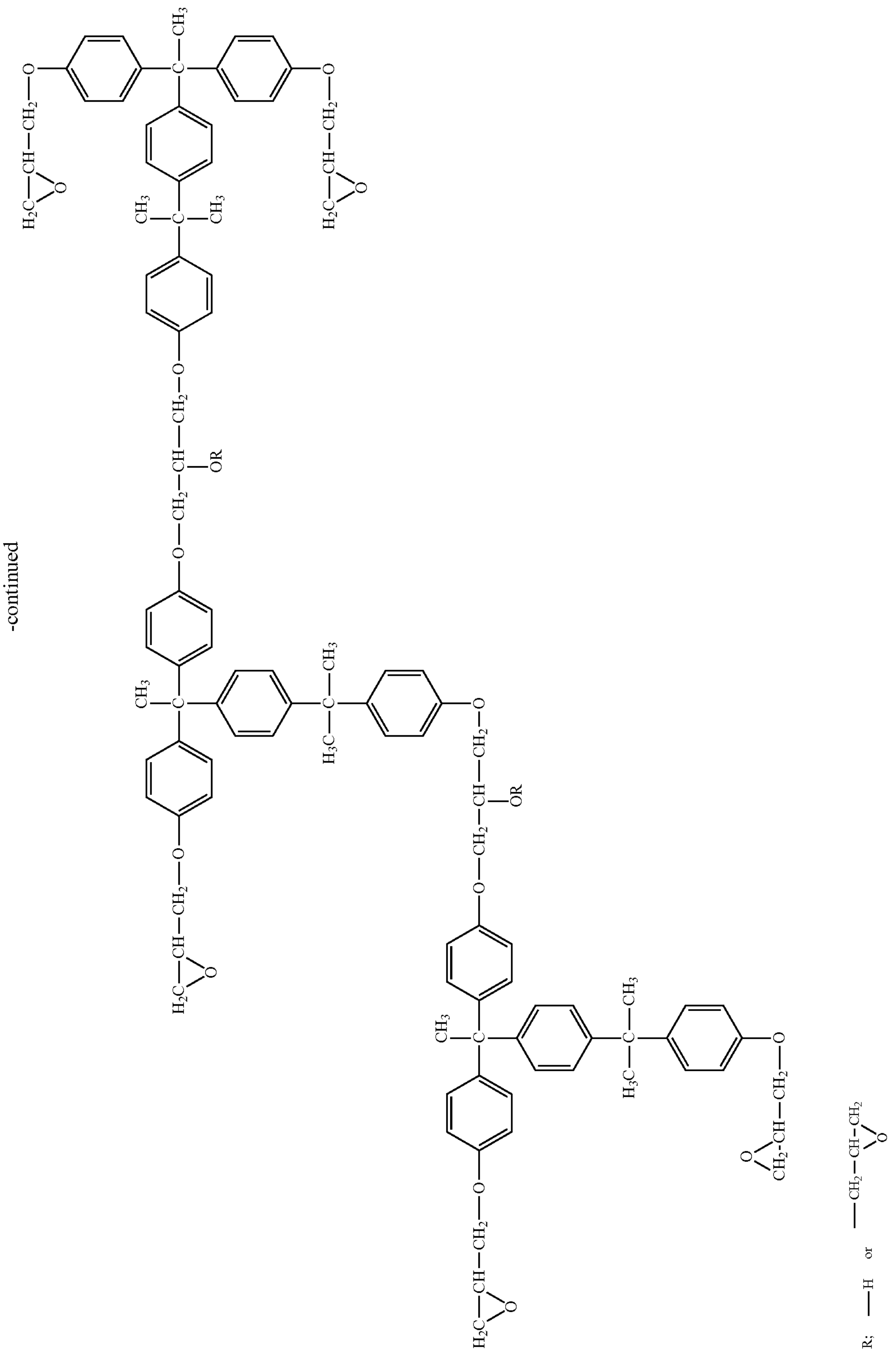

As far as the present invention is concerned, for example, an epoxy resin represented by formula (2) means an epoxy resin whose major component is an epoxy resin represented by formula (2) (the number k of repeating units is an average), and also includes the case where by-products generated in the production of the epoxy resin, a high-molecular-weight form of the epoxy resin, and the like are contained. The same also applies to epoxy resins represented by formulas other than formula (2).

Specific examples of the epoxy resin (B-1) represented by the above formula (2) include KM-N-LCL (trade name, bisphenol A novolac type epoxy resin, manufactured by Nippon Kayaku Co., Ltd., epoxy equivalent weight: 195 to 210 g/eq, softening point: 78 to 86° C.), EPIKOTE 157 (trade name, bisphenol A novolac type epoxy resin, manufactured by Mitsubishi Chemical Corporation, epoxy equivalent weight: 180 to 250 g/eq, softening point: 80 to 90° C.), and EPON SU-8 (trade name, bisphenol A novolac type epoxy resin, manufactured by Resolution Performance Products LLC, epoxy equivalent weight: 195 to 230 g/eq, softening point: 80 to 90° C.).

Specific examples of the epoxy resin (B-2) represented by the above formula (3) include NC-3000 series (trade name, biphenyl phenol novolac type epoxy resin, manufactured by Nippon Kayaku Co., Ltd., epoxy equivalent weight: 270 to 300 g/eq, softening point: 55 to 75° C.). As a preferred example of NC-3000 series. NC-3000H can be mentioned.

Specific examples of the epoxy resin (B-3) represented by the above formula (4) include NER-7604 and NER-7403 (each trade name, bisphenol F type epoxy resin with alcoholic hydroxyl groups partially epoxidized, manufactured by Nippon Kayaku. Co., Ltd., epoxy equivalent weight: 200 to 500 g'eq, softening point: 55 to 75° C.) and NER-1302 and NER-7516 (each trade name, bisphenol A type epoxy resin with alcoholic hydroxyl groups partially epoxidized, manufactured by Nippon Kayaku Co., Ltd., epoxy equivalent weight: 200 to 500 g/eq, softening point: 55 to 75° C.).

Specific examples of the epoxy resin (B-4) represented by the above formula (5) include EOCN-1020 (trade name, manufactured by Nippon Kayaku Co., Ltd., epoxy equivalent weight: 190 to 210 g/eq. softening point: 55 to 85° C.).

Specific examples of the epoxy resin (B-5), which is a reaction product between a phenol derivative represented by the above formula (6) and an epihalohydrin, include NC-6300 (trade name, manufactured by Nippon Kayaku Co., Ltd., epoxy equivalent weight: 230 to 235 g/eq, softening point: 70 to 72° C.).

Examples of the epoxy resin (B-6) include a polycarboxylic acid epoxy compound whose production method is described in Japanese Patent No. 2698499. The epoxy equivalent weight and softening point thereof can be appropriately depending on the kind of an epoxy resin to be used as a raw material for the epoxy resin (B-6) and the ratio of the substituent to be introduced.

Specific examples of the epoxy resin (B-7) represented by the above formula (7) include EPPN-201-L (trade name, manufactured by Nippon Kayaku Co., Ltd., epoxy equivalent weight: 180 to 200 g/eq, softening point: 65 to 78° C.).

Specific examples of the epoxy resin (B-8) represented by the above formula (8) include EPPN-501H (trade name, manufactured by Nippon Kayaku Co., Ltd., epoxy equivalent weight: 162 to 172 g/eq, softening point: 51 to 57° C.), EPPN-501HY (trade name, manufactured by Nippon Kayaku Co., Ltd., epoxy equivalent weight: 163 to 175 g/eq, softening point: 57 to 63° C.), and EPPN-502H (trade name, manufactured by Nippon Kayaku Co., Ltd., epoxy equivalent weight: 158 to 178 g/eq, softening point: 60 to 72° C.).

Specific examples of the epoxy resin (13-9) represented by the above formula (9) include XD-1000 (trade name, manufactured by Nippon Kayaku Co., Ltd., epoxy equivalent weight: 245 to 260 g/eq, softening point: 68 to 78° C.).

The epoxy equivalent weight of component (B) contained in the negative-acting photosensitive resin composition of the present invention is preferably 150 to 500, and more preferably 150 to 450.

The weight-average molecular weight of component (B) contained in the negative-acting photosensitive resin composition of the present invention is preferably 500 to 15,000, and more preferably 500 to 9,000.

The softening point of component (B) contained in the negative-acting photosensitive resin composition of the present invention is preferably 40 to 120° C., and more preferably 40 to 110° C., 55 to 120° C., or 55° C. to 110° C.

Herein, the epoxy equivalent weight in the present invention means a value measured by the method in accordance with JIS K7236. The weight-average molecular weight in the present invention is a weight-average molecular weight value determined in terms of polystyrene based on the measurement result of gel permeation chromatography. The softening point in the present invention is a value measured by the method in accordance with JIS K7234.

The content of component (A) in the negative-acting photosensitive resin composition of the present invention is 1 to 50 mass %, preferably 2 to 30 mass %, and still more preferably 3 to 20 mass %, relative to component (B).

In addition, in other embodiment, the content of component (A) in the negative-acting photosensitive resin composition of the present invention is preferably 1 to 30 mass %, 1 to 20 mass %, 2 to 50 mass %, 2 to 20 mass %, 3 to 50 mass %, or 3 to 30 mass %, relative to component (B).

The negative-acting photosensitive resin composition of the present invention contains (C) a cationic photopolymerization initiator (hereinafter simply referred to as "component (C)").

Component (C) contained in the photosensitive resin composition of the present invention is such a compound that it generates cations in response to irradiation with UV rays, far UV rays, excimer lasers such as KrF or ArF, or radiation such as X-rays or electron rays, and the cations can serve as a polymerization initiator.

Examples of component (C) include an aromatic iodonium complex salt and an aromatic sulfonium complex salt.

Specific examples of the aromatic iodonium complex salt include diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, tolylcumyliodonium tetrakis(pentafluorophenyl)borate (manufactured by Rhodia, trade name: RHODORSIL P12074), and di(4-tertiarybutyl)iodonium tris(trifluoromethanesulfonyl)methanide (manufactured by BASF, trade name: CGI BBI-C1).

Specific examples of the aromatic sulfonium complex salt include 4-thiophenyldiphenylsulfonium hexafluoroantimonate (manufactured by San-Apro Ltd., trade name: CPI-101A), thiophenyldiphenylsulfonium tris(pentafluoroethyl)trifluorophosphate (manufactured by San-Apro Ltd., trade name: CPI-210S), 4-{4-(2-chlorobenzoyl)phenylthio}phenylbis(4-fluorophenyl)sulfonium hexafluoroantimonate (manufactured by ADEKA Corporation, trade name: SP-172), a mixture of aromatic sulfonium hexafluoroantimonates containing 4-thiophenyldiphenylsulfonium hexafluoroantimonate (manufactured by ACETO Corporate USA, trade name: CPI-6976), triphenylsulfonium tris(trifluoromethanesulfonyl)methanide (manufactured by BASF, trade name: CGI TPS-C1), tris[4-(4-acetylphenyl)sulfonylphenyl]sulfonium tris(trifluoromethylsulfonyl)methide (manufactured by BASF, trade name: GSID 26-1), and tris[4-(4-acetylphenyl)sulfonylphenyl]sulfonium tetrakis(2,3,4,5,6-pentafluorophenyl)borate (manufactured by BASF, trade name: IRGACURE PAG290). Among these examples of component (C), in the present invention, aromatic sulfonium complex salts, which have high vertical rectangular processability and high thermal stability in the photosensitive image formation step, are preferable. Among them, 4-{4-(2-chlorobenzoyl)phenylthio}phenylbis(4-fluorophenyl)sulfonium hexafluoroantimonate, a mixture of aromatic sulfonium hexafluoroantimonates containing 4-thiophenyl-diphenylsulfonium hexafluoroantimonate, and tris[4-(4-acetylphenyl)sulfonylphenyl]sulfonium tetrakis(2,3,4,5,6-pentafluorophenyl)borate are particularly preferable.

Component (C) may be used alone in the negative-acting photosensitive resin composition of the present invention, and it is also possible to use two or more kinds in combination. Component (C) has an action of absorbing light. Therefore, in the case of a thick film (e.g., 50 μm or more), when a large amount of component (C) is used (e.g., more than 15 mass %), at the time of curing, it tends to be difficult for light to sufficiently penetrate deep into the film. Meanwhile, when a small amount is used (e.g., less than 3 mass %), it is not easy to obtain a sufficient curing rate. In the case of a thin film, the addition of a small amount of component (C) 1 mass % or more) exerts sufficient performance, Conversely, in the case of a thin film, when a large amount of component (C) is used, although there is no problem with the deep penetration of light, because an expensive initiator is used in an amount more than needed, this is not economical. From these points of view, the blending proportion of component (C) in the photosensitive resin composition of the present invention is usually 0.1 to 10 mass %, preferably 0.5 to 5 mass %, relative to the total mass of component (A) and component (B). In addition, in other embodiment, the blending proportion of the component (C) in the photosensitive resin composition of the present invention may be 0.1 to 5 mass %, or 0.5 to 10 mass %, relative to the total mass of component (A) and component (B). However, in the case where the molar absorption coefficient of component (C) at a wavelength of 300 to 380 nm is high, the blending amount has to be appropriately controlled depending on the thickness of a film to be formed from the photosensitive resin composition.

In the negative-acting photosensitive resin composition of the present invention, separately from the epoxy resin as component (B), in order to improve the pattern performance, (D) a reactive epoxy monomer having miscibility may be added. As the reactive epoxy monomer of component (D), a glycidyl ether compound that is liquid at room temperature can be used. Examples of such a glycidyl ether compound include diethylene glycol diglycidyl ether, hexanediol diglycidyl ether, dimethylolpropane diglycidyl ether, polypropylene glycol diglycidyl ether (manufactured by ADEKA Corporation, ED506), trimethylolpropane triglycidyl ether (manufactured by ADEKA Corporation, ED505), trimethylolpropane triglycidyl ether (low-chlorine type, manufactured by Nagase ChemteX Corporation, EX321L), pentaerythritol tetraglycidyl ether, and dicyclopentadienedimethanol diglycidyl ether (manufactured by ADEKA Corporation, EP4088L). Further, because these epoxy monomers generally have a high chlorine content, it is preferable to use a low-chlorine type that has undergone a low-chlorine manufacturing method or a purification step. They may be used alone, and it is also possible to use a mixture of two or more kinds.

The reactive epoxy monomer component is used for the purpose of improving the reactivity of a resist or improving the physical properties of a cured film. Compounds usable as the reactive epoxy monomer component are often liquid. In the case where the component is liquid, when such a component is blended in an amount of more than 20 mass % relative to the total amount of the photosensitive resin composition, the film after solvent removal may become sticky, whereby mask sticking is likely to occur, for example; thus, such an amount may be inappropriate. From this viewpoint, in the case where a monomer component is blended, the blending proportion thereof is preferably 10 mass % or less and more than 0 mass %), particularly preferably 7 mass % or less, relative to the total mass of components (A) and (B).

In the negative-acting photosensitive resin composition of the present invention, in order to reduce the viscosity of the composition and improve the coating operability, a solvent may be added. As the solvent, any organic solvent that is commonly used for inks, paints, and the like and capable of dissolving each constituent component of the photosensitive resin composition can be used without particular limitation. Specific examples of the solvent include ketones such as acetone, methyl ethyl ketone, cyclohexanone, and cyclopentanone, aromatic hydrocarbons such as toluene, xylene, and tetramethyl benzene, glycol ethers such as ethylene glycol dimethyl ether, dipropylene glycol dimethyl ether, and dipropylene glycol diethyl ether, esters such as ethyl acetate, butyl acetate, butyl cellosolve acetate, carbitol acetate, propylene glycol monomethyl ether acetate, and γ-butyrolactone, alcohols such as methanol, ethanol, cellosolve, and methyl cellosolve, aliphatic hydrocarbons such as octane and decane, and petroleum-based solvents such as petroleum ether, petroleum naphtha, hydrogenated petroleum naphtha, and solvent naphtha.

These solvents may be used alone, and it is also possible to use a mixture of two or more kinds. The solvent component is added for the purpose of adjusting the film thickness and coating operability at the time of application to a substrate. In order to properly maintain the solubility of the major components, the volatility of components, the liquid viscosity of the composition, and the like, the amount of solvent used is preferably 95 mass % or less, more preferably 10 to 90 mass %, in the negative-acting photosensitive resin composition.

In the negative-acting photosensitive resin composition of the present invention, for the purpose of improving the adhesion of the composition to a substrate, an adhesion imparting agent having miscibility may be used. As the adhesion imparting agent, a coupling agent such as a silane coupling agent or a titanium coupling agent can be used. It is preferable to use a silane coupling agent.

Examples of the silane coupling agent include 3-chloropropyltrimetoxysilane, vinyltrichlorosilane, vinyltriethoxysilane, vinyltrimethoxysilane, vinyl/tris(2-methoxyethoxy) silane, 3-methacryloxy propyl trimethoxysilane, 2-(3,4-epoxycyclohexyl)ethyltrimethoxysilane, 3-glycidoxylpropyltrimetoxysilane, 3-mercaptopropyltrimethoxysilane, 3-aminopropyltriethoxysilane, N-2-(aminoethyl)-3-aminopropyltrimethoxysilane, and 3-ureidopropyl triethoxysilane. These adhesion imparting agents may be used alone, and it is also possible to use a combination of two or more kinds.

The adhesion imparting agent is not reactive with the major components. Accordingly, a portion of the adhesion imparting agent other than that acting on the substrate interface will remain as a residual component after curing. Therefore, use of a large amount of adhesion imparting agent may cause deterioration in physical properties. For some substrates, the adhesion imparting agent exerts its effect even in a small amount. Therefore, its use in an amount within a range where deterioration in the physical properties of a cured product is not caused is suitable. The proportion of the adhesion imparting agent used is preferably 15 mass % or less, more preferably 5 mass % or less, in the negative-acting photosensitive resin composition.

In the negative-acting photosensitive resin composition of the present invention, a sensitizing agent for absorbing UV rays and supplying the absorbed light energy to a cationic photopolymerization initiator may be further used. Preferred examples of the sensitizing agent include a thioxanthone and an anthracene compound having alkoxy groups at the 9-position and the 10-position (9,10-dialkoxyanthracene derivatives). Examples of the alkoxy group include $C_{1-4}$ alkoxy groups such as a methoxy group, an ethoxy group, a propoxy group, and a butoxy group. The 9,10-dialkoxyanthracene derivative may further have a substituent. Examples of such a substituent include halogen atoms such as a fluorine atom, a chlorine atom, a bromine atom, and an iodine atom, $C_{1-4}$ alkyl groups such as a methyl group, an ethyl group, and a propyl group, sulfonic acid alkyl ester groups, and carboxylic acid alkyl ester groups. Examples of the alkyl group in such a sulfonic acid alkyl ester group or carboxylic acid alkyl ester group include $C_{1-4}$ alkyls such as methyl, ethyl, and propyl. The substitution position of these substituents is preferably the 2-position.

Specific examples of such a thioxanthone include 2,4-dimethyl thioxanthone, 2,4-diethyl thioxanthone, 2-chlorothioxanthone, 2,4-diisopropyl thioxanthone, and 2-isopropyl thioxanthone. 2,4-Diethyl thioxanthone (trade name: KAYACURE DETX-S, manufactured by Nippon Kayaku Co., Ltd.) and 2-isopropyl thioxanthone are preferable.

Examples of the 9,10-dialkoxyanthracene derivative include 9,10-dimethoxyanthracene, 9,10-diethoxyanthracene, 9,10-dipropoxyanthracene, 9,10-dibutoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene-2-sulfonic acid methyl ester, 9,10-diethoxyanthracen-2-sulfonic acid methyl ester, and 9,10-dimethoxyanthracene-2-carboxylic acid methyl ester.

These sensitizing agents may be used alone, and it is also possible to use a mixture of two or more kinds. It is most preferable to use 2,4-diethylthioxanthone and 9,10-dimethoxy-2-ethylanthracene. Such a sensitizing agent exerts its effect in a small amount. Therefore, the proportion thereof used is preferably 30 mass % or less, more preferably 20 mass % or less, relative to the amount of component (C).

In the negative-acting photosensitive resin composition of the present invention, in the case where it is necessary to reduce the adverse effects of ions from component (C), an ion catcher may be added. Examples of such an ion catcher include alkoxy aluminums such as trismethoxy aluminum, trisethoxy aluminum, trisisopropoxy aluminum, isopropoxydiethoxy aluminum, and trisbutoxy aluminum, phenoxy aluminums such as trisphenoxy aluminum and trisparamethylphenoxy aluminum, and organic aluminum compounds such as trisacetoxy aluminum, trisstearate aluminum, trisbutyrate aluminum, trispropionate aluminum, trisacetylacetonate aluminum, tristrifluoroacetylacenate aluminum, trisethylacetoacetate aluminum, diacetylacetonate dipivaloylmethanato aluminum, and diisopropoxy (ethylacetoacetate) aluminum. These ion catchers may be used alone, and it is also possible to use a combination of two or more kinds. The blending amount thereof may be 10 mass % or less relative to the total solid content (all the components excluding a solvent) of the negative-acting photosensitive resin composition of the present invention.

In the negative-acting photosensitive resin composition of the present invention, various additives such as thermoplastic resins, coloring agents, thickening agents, defoaming agents, and leveling agents can be further added as necessary. Examples of the thermoplastic resin include polyethersulfone, polystyrene, and polycarbonate. Examples of the coloring agent include phthalocyanine blue, phthalocyanine green, iodine green, crystal violet, titanium oxide, carbon black, and naphthalene black. Examples of the thickening agent include Orben, Benton, and montmorillonite. Examples of the defoaming agent include silicone-based, fluorine-based, and polymer-based defoaming agents. In the case where these additives and the like are used, the amounts thereof used are, as a tentative guide, each 30 mass % or less in the photosensitive resin composition of the present invention, for example. The amount can be suitably increased or decreased according to the purpose of use.

In the negative-acting photosensitive resin composition of the present invention, an inorganic filler, such as barium sulfate, barium titanate, silicon oxide, amorphous silica, talc, clay, magnesium carbonate, calcium carbonate, aluminum oxide, aluminum hydroxide, or mica powder, can be added. The amount of inorganic filler added may be 60 mass % or less in the photosensitive composition of the present invention.

The negative-acting photosensitive resin composition of the present invention can be prepared simply by blending the essential components, that is, component (A), component (B), and component (C), together with a solvent and various additives and the like as necessary, followed by mixing and stirring in a usual manner. As necessary, these components may also be dispersed and mixed using a dispersing machine such as dissolver, a homogenizer, or a three-roll mill. In addition, after mixing, filtration using may also be performed using a mesh, a membrane filter, or the like.

The negative-acting photosensitive resin composition of the present invention is preferably used in the form of a solution having added thereto a solvent. The negative-acting photosensitive resin composition of the present invention dissolved in a solvent can be used as follows. First, for example, onto a metal substrate made of silicon, aluminum, copper, or the like, a ceramic substrate made of lithium tantalate, glass, silicon oxide, silicon nitride, or the like, or a substrate made of polyimide, polyethylene terephthalate, or the like, the negative-acting photosensitive resin composition of the present invention is applied to a thickness of 0.1 to 1,000 μm using a spin coater. Subsequently, the solvent is removed under healing conditions of 60 to 130° C. for about S to 60 minutes to form a negative-acting photosensitive resin composition layer, the layer is prebaked, and then a mask having a predetermined pattern is placed thereon, followed by UV irradiation. Subsequently, a heating treatment is performed under conditions of 50 to 130° C. for about 1 to 50 minutes (post-exposure baking), and then the unexposed part is subjected to a development treatment using a liquid developer under conditions of room temperature to 50° C. for about 1 to 180 minutes, thereby forming a pattern. Finally, a heating treatment is performed under conditions of 130 to 230° C. (hard baking treatment). As a result, a cured product satisfying the various properties can be obtained. These treatment conditions are not limited, and they are typical examples. As the liquid developer, for example, an organic solvent such as y-butyrolactone, triethylene glycol dimethyl ether, or propylene glycol monomethyl ether acetate, or a mixture of the organic solvent and water may be used. For development, a paddle-type, spray-type, shower-type, or like developing device can be used. As necessary, ultrasonic irradiation may also be performed. Incidentally, as a preferred metal substrate to which the negative-acting photosensitive resin composition of the present invention is applied, aluminum can be mentioned.

The negative-acting photosensitive resin composition of the present invention can be formed into a dry film resist by applying the composition onto a base film using a roll coater, a die coater, a knife coater, a bar coater, a gravure coater, or the like, followed by drying in a drying oven set at 45 to 100° C. to remove a predetermined amount of solvent, and, as necessary, laminating a cover film or the like. At this time, the thickness of the resist on the base film can be adjusted to 2 to 100 μm. As each of the base film and the cover film, for example, a film made of polyester, polypropylene, polyethylene, TAC, polyimide, and the like may be used. As such a film, as necessary, a film that has been release-treated with a silicone-based release treatment agent, a non-silicone-based release treatment agent, or the like may be used. The dry film resist may be used, for example, as follows. The cover film is removed, and the dry film is transferred to a substrate using a hand roll, a laminator, or the like at a temperature of 40 to 100° C. under a pressure of 0.05 to 2 MPa, followed by exposure, post-exposure baking, development, and a heating treatment as for the negative-acting photosensitive resin composition dissolved in a solvent.

When the negative-acting photosensitive resin composition is supplied as a dry film as illustrated above, it is possible to omit the steps of application onto a support and drying. Thereby, the formation of a cured product pattern using the negative-acting photosensitive resin composition of the present invention can be achieved in a simpler manner.

When used as a MEMS package or a semiconductor package, the negative-acting photosensitive resin composition of the present invention can be used to cover the MEMS or semiconductor device or provide the MEMS or semiconductor device with a hollow structure. As a substrate for MEMS and semiconductor packages, a substrate obtained by forming a thin metal film of aluminum, gold, copper, chromium, titanium, or the like on a silicon wafer of any of various shapes by sputtering or vapor deposition to a film thickness of 10 to 5,000 Å, followed by microprocessing of the metal by an etching method or the like, can be used, for example. In some cases, as an inorganic protection film, a film of silicon oxide or silicon nitride may be further formed to a film thickness of 10 to 10,000 Å. Then, a MEMS or semiconductor device is fabricated or installed on the substrate. In order to shield the device from the outside air, it is necessary to fabricate a cover or a hollow structure. In the case of covering with the negative-acting photosensitive resin composition of the present invention, the above method may be employed. In addition, the case of fabricating a hollow structure, a partition wall is formed on the substrate by the above method, then a dry film is further laminated thereon by the above method, and also patterning is performed to form a lid on the partition wall, whereby a hollow package structure can be fabricated. In addition, after the fabrication, as necessary, a heating treatment is performed at 130 to 200° C. for 10 to 120 minutes, whereby MEMS package parts and semiconductor package parts satisfying desired properties can be obtained.

Incidentally, the term "package" commonly means an encapsulation method used for blocking the ingress of outside gas or liquid in order to maintain the stability of a substrate, interconnection, device, and the like, or a product resulted from such a method. The term "package" referred to herein means packages for a part having an actuator such as MEMS, hollow packages for packaging an oscillator such as a SAW device, surface protection for preventing the deterioration of semiconductor substrates, printed wiring boards, interconnections, and the like, plastic encapsulation, etc. Further, the term "wafer level package" referred to herein means a package construction method in which protection film formation, terminal formation, wiring, and packaging are completed in the wafer state, followed by cutting into chips, or to a produce thereof.

The negative-acting photosensitive resin composition of the present invention exhibits excellent effects in that it has good image resolution and a high elastic modulus at high temperatures, and also the adhesion to various substrates other than silicon wafers is excellent. Therefore, this negative-acting photosensitive resin composition can be used, for example, in the manufacturing of MEMS (micro electro mechanical system) parts, micromachine parts, microfluid parts, μ-TAS (micro total analysis system) parts, inkjet printer parts, microreactor parts, conductive layers, LIGA parts, molds and stamps for micro injection molding and heat embossing, screens and stencils for fine printing applications, MEMS package parts, semiconductor package parts, BioMEMS and bio-photonic devices, and printed wiring boards, for example. Among them, the composition is particularly useful in MEMS package parts and semiconductor package parts.

Incidentally, the structure identification and the content analysis of each of the components contained in the negative-acting photosensitive resin composition as a product (a mixture of a plurality of components), that is, the compound having a triazine ring as component (A), the epoxy resin having a benzene backbone and at least two epoxy groups in one molecule as component (B), and the cationic photopolymerization initiator as component (C), can be performed by comparison with the analysis results from a standard sample by $^{1}$H-NMR, $^{13}$C-NMR, LC-MS measurement, or the like. In addition, when the structure of the epoxy resin as component (B) is determined, its epoxy equivalent weight, weight-average molecular weight, and softening point can be obtained.

EXAMPLES

Hereinafter, the present invention will be described with reference to examples. These examples are merely illustrative for suitably describing the present invention, and the scope of the present invention is not limited to the following examples.

Examples 1 to 4 and Comparative Examples 1 and 2 (Preparation of Photosensitive Resin Compositions)

Following the blending amounts (unit: parts by mass) shown in Table 1, the compound having a triazine ring as component (A), the epoxy resin as component (B), and the cationic photopolymerization initiator as component (C), and other components were stir-mixed in a flask equipped with an stirrer at 60° C. for 2 hours, thereby giving negative-acting photosensitive resin compositions of the present invention and for comparison.

(Application, Drying, Exposure, and Development of Photosensitive Resin Layer)

Onto each of a silicon (Si) wafer substrate and a substrate obtained by plasma. CVD deposition of silicon nitride (SiN) to a film thickness of 1,000 Å on a silicon wafer, the negative-acting photosensitive resin compositions of Examples 1 to 4, Comparative Example 1, and Comparative Example 2 were each applied using a spin coater to a film thickness (film thickness after drying) of 20 μm, and then dried under conditions of 120° C.×2 minutes using a hot plate, thereby providing each negative-acting photosensitive resin composition layer. The substrate having provided thereon the negative-acting photosensitive resin composition layer was prebaked using a hot plate under conditions of 65° C.×5 minutes and then 95° C.×15 minutes, and further subjected to pattern exposure (soft contact, i-line) using: an i-line exposure device (mask aligner, manufactured by Ushio Inc.). The substrate after exposure was subjected to post-exposure baking (PEB) at 95° C.×6 minutes using a hot plate, and then to a development treatment at 23° C.×6 minutes using: propylene glycol monomethyl ether acetate by a dipping method, followed by a hard baking treatment in an oven at 200° C. (in a nitrogen atmosphere) for 60 minutes, thereby giving a cured negative-acting photosensitive resin composition pattern on the Si wafer substrate and the substrate having formed thereon the SiN film.

(Sensitivity Evaluation of Negative-Acting Photosensitive Resin Composition)

In the pattern exposure on the silicon (Si) wafer substrate, the exposure dose resulting in the best mask transfer accuracy was defined as an optimum exposure dose, and the sensitivity of each negative-acting photosensitive resin composition was evaluated. In the evaluation results, a smaller value of the optimum exposure dose indicates that the composition has higher sensitivity. The results are shown in Table 1 below.

(Resolution Evaluation of Negative-Acting Photosensitive Resin Composition)

In the pattern exposure at the optimum exposure dose obtained in the above sensitivity evaluation of the negative-acting photosensitive resin composition, among resist patterns resolved without residues at a line and space of 1:1, the width of the narrowest pattern adhering to the substrate was measured, and the resolution of the negative-acting photosensitive resin composition was evaluated. The results are shown in Table 1 below.

Evaluation Criteria

○ (Excellent): The width of the narrowest pattern was 10 μm or less.

x (Poor): The width of the narrowest pattern was more than 10 μm.

(Evaluation of Adhesion Force of Negative-Acting Photosensitive Resin Composition to Si and SiN)

The adhesion force referred to herein means shear strength determined at the time when the pattern is peeled off from the substrate as a result of applying force from the side surface part of the pattern using a share tool. When this value is higher, the adhesion force between the substrate and the resin composition is higher, which is more preferable. Specifically, on each substrate, a block-shaped resist pattern of 100 μm×100 μm (film thickness: 20 μm) was formed at the optimum exposure dose obtained above, then, using a bonding tester (manufactured by Rhesca Co., Ltd.), a load was applied from the side to a position 3 μm high from the substrate at a speed of 50 μm/sec using a share tool of 100 μm, and the resulting breaking load was measured. The results are shown in Table 1 below.

(Heat Resistance Evaluation of Negative-Acting Photosensitive Resin Composition)

A cured product of the negative-acting photosensitive resin composition was prepared at the optimum exposure dose obtained in the above sensitivity evaluation of the negative-acting photosensitive resin composition, and, using a DMA measurement device (manufactured by TA Instruments, RSA-G2), the elastic modulus at 175° C. was measured under the following conditions: tensile mode: 1 Hz, ramp rate: 3° C./sec. The results are shown in Table 1 below.

TABLE 1

| | | | Examples | | | | Comparative Examples | |
|---|---|---|---|---|---|---|---|---|
| | | | 1 | 2 | 3 | 4 | 1 | 2 |
| (A) Compound having a triazine ring | TEPIC-VL | A-1 | 10.0 | | 20.0 | 10.0 | | |
| | TEPIC-UC | A-2 | | 10.0 | | | | |
| | KM-N-LCL | B-1 | 53.0 | 53.0 | 53.0 | 53.0 | 53.0 | 53.0 |
| (B) Epoxy resin | NC-3000H | B-2 | 25.0 | 25.0 | 25.0 | 25.0 | 25.0 | 25.0 |
| | NER-7604 | B-3 | 15.0 | 15.0 | 15.0 | 15.0 | 15.0 | 15.0 |
| | jER-1007 | B-4 | | | | | | 10.0 |
| (C) Cationic photopolymerization initiator | PAG-290 | C-1 | 1.0 | 1.0 | 1.5 | 1.5 | 1.0 | 1.0 |
| (D) Reactive epoxy monomer | EX-321L | D-1 | 5.0 | 5.0 | 5.0 | 5.0 | 5.0 | 5.0 |
| | EP-4088L | D-2 | | | | 5.0 | | |
| Coupling agent | S-510 | E | 1.5 | 1.5 | 5.0 | 5.0 | 1.5 | 1.5 |
| Others | FT-222F | F | 0.03 | 0.03 | 0.03 | 0.03 | 0.03 | 0.03 |
| Solvent | MMM | G | 47.4 | 47.4 | 53.4 | 51.2 | 43.1 | 47.4 |
| Shear strength | Si (Mpa) | | 55 | 51 | 54 | 53 | 40 | 50 |
| Shear strength | SiN (Mpa) | | 45 | 36 | 44 | 44 | 29 | 36 |
| Elastic modulus | E'@175 (Gpa) | | 1.5 | 1.3 | 1.5 | 1.3 | 1.2 | 0.9 |

TABLE 1-continued

| | | Examples | | | | Comparative Examples | |
|---|---|---|---|---|---|---|---|
| | | 1 | 2 | 3 | 4 | 1 | 2 |
| Optimum exposure dose | (mJ) | 320 | 240 | 400 | 240 | 120 | 150 |
| Minimum resolution line width | | ○ | ○ | ○ | ○ | ○ | ○ |

In addition, the symbols (A-1) to (G) indicated in Table 1 are as follows.

(A-1): Tradename: TEPIC-VL, manufactured by Nissan Chemical Corporation, epoxy equivalent weight: 135 g/eq (a compound having a triazine ring represented by formula (1), wherein all $R_1$s are organic groups represented by formula (1-1) wherein $R_2$ is an n-propylene group)

(A-2): Trade name: TEPIC-UC, manufactured by Nissan Chemical Corporation, epoxy equivalent weight: 195 g/eq (a compound having a triazine ring represented by formula (1), wherein each $R_1$ is independently represented by formula (1-3)

(B-1): Trade name: KM-N-LCL, manufactured by Nippon Kayaku Co., Ltd., epoxy equivalent weight 210 g/eq, softening point: 85 °C, weight-average molecular weight: 8,000, average number of repeating units k = 4 (epoxy resin represented by formula (2))

(B-2): Trade name: NC-3000H, manufactured by Nippon Kayaku Co., Ltd., epoxy equivalent weight: 285 g/eq., softening point 65 °C, weight-average molecular weight: 700, average number of repeats p = 2 (epoxy resin represented by formula (3))

(B-3): Trade name: NER-7604, manufactured by Nippon Kayaku Co., Ltd., epoxy equivalent weight: 347 g/eq., softening point 71 °C, weight-average molecular weight: 9,000, average number of repeats n = 4, m ≤ 1 (epoxy resin represented by formula (4))

(B-4): Trade name: jER-1007, manufactured by Mitsubishi Chemical Corporation, epoxy equivalent weight: 2,000 g/eq, weight-average molecular weight: 2,900

(C-1): Photoacid generator (tris[4-(4-acetylphenyl)sulfonylphenyl]sulfonium tetrakis(2,3,4,5,6-pentafluorophenyl)borate, trade name: PAG290, manufactured by BASF (D-1): Trade name: EX-321L, manufactured by Nagase ChemteX Corporation, epoxy equivalent weight: 140 g/eq (trimethylolpropane triglycidyl ether)

(D-2): Trade name: EP-4088L, manufactured by ADEKA Corporation, epoxy equivalent weight: 165 g/eq (dicyclopentadienedimethanol diglycidyl ether)

(E): Silane coupling agent (trade name: S-510, manufactured by Chisso Corporation)

(F): Leveling agent (trade name: Ftergent 222F, manufactured by Neos Company Limited)

(G): Solvent (ethyleneglycol dimethyl ether, trade name: Hisolve MMM, manufactured by TOHO Chemical Industry Co., Ltd.

From the results shown in Table 1, it is clear that as compared with the negative-acting photosensitive resin compositions of Comparative Examples 1 and 2, the elastic modulus at 175° C. of each of the negative-acting photosensitive resin compositions of the present invention (Examples 1 to 4) is higher, and the adhesion to Si and SiN is also high (at least comparable).

(Evaluation of Adhesion Force of Negative-Acting Photosensitive Resin Composition to LT and Al)

In the same manner as in the above sensitivity evaluation and the above evaluation of adhesion force to Si and SiN, the adhesion force of the negative-acting photosensitive resin compositions of Example 1 and Comparative Example 1 to a LT (lithium tantalate) substrate and an Al (aluminum) substrate was evaluated. The results are shown in Table 2 below. In addition, the unit of the numerical values indicated in Table 2 is "MPa."

TABLE 2

| | Example 1 | Comparative Example 1 |
|---|---|---|
| LT | 44 | 21 |
| Al | 44 | 24 |

From the results in Table 2, it is clear that as compared with the negative-acting photosensitive resin composition of Comparative Example 1, both the adhesion to LT and the adhesion to Al of the negative-acting photosensitive resin composition of the present invention (Example 1) are also higher.

(Preparation of Sample for Evaluation of Residues after Development)

"Residues after development" referred to herein means portions of the negative-acting photosensitive resin composition remaining undissolved, which are supposed to be removed by a development treatment but remain in the unexposed part after development.

Onto a PET film, the negative-acting photosensitive resin compositions of Example 1, Example 3, Example 4, Comparative Example 1, and Comparative Example 2 were each applied using an applicator. Subsequently, the solvent was dried under conditions of 120° C.×2 minutes using a hot plate, thereby providing each negative-acting photosensitive resin composition layer (dry film) having a thickness of 20 μm. Onto each of the negative-acting photosensitive resin composition layer obtained above, a PET film was attached under conditions of 60° C. and 0.3 MPa using a laminator. The resulting samples for evaluation were exposed to an atmosphere having a temperature of 40° C. and a humidity of 90% RH for two weeks.

(Evaluation of Residue after Development)

From the sample for evaluation obtained above, the PET film on one side was peeled off, and the exposed negative-acting photosensitive resin composition layer was attached onto a silicon (Si) wafer substrate using a laminator under conditions of 60° C. and 0.3 MPa, and then subjected to a heat treatment at 65° C.×5 minutes on a hot plate. Next, the remaining PET film on the other side was peeled off, and the obtained silicon (Si) wafer substrate provided with the negative-acting photosensitive resin composition layer was subjected to a development treatment at 23° C.×6 minutes using propylene glycol monomethyl ether acetate by a dipping method. The unexposed part of the silicon (Si) wafer substrate after the development treatment was observed at a magnification of 50 using a microscope (manufactured by Nikon Corporation, ECLIPS L150). A sample having no residues was rated as ○ (excellent), and a sample having residues was rated as x (poor). The results are shown in Table 3 below.

TABLE 3

| | Example 1 | Example 3 | Example 4 | Comparative Example 1 | Comparative Example 2 |
|---|---|---|---|---|---|
| Residues after development | ○ | ○ | ○ | x | x |

From the results in Table 3, it is clear that as compared with the negative-acting photosensitive resin compositions of Comparative Example 1 and Comparative Example 2, each of the negative-acting photosensitive resin compositions of the present invention (Example 1, Example 3, and Example 4) is more effective in suppressing the generation of residues after development.

INDUSTRIAL APPLICABILITY

The photosensitive resin composition according to the present invention allows for the formation of patterns with high adhesion to various substrates, and is also highly effective in preventing the generation of residues after development. Accordingly, the photosensitive resin composition is suitable for use in the fields of MEMS package parts, semiconductor packages, and the like. In particular, in the polymer capping of a SAW/BAW filter or the like, because the photosensitive resin composition of the present invention has good elastic modulus at high temperatures and also good adhesion to various materials, the composition is advantageous in cavity formation at the time of molding, can make a final product thinner, and is expected to widen the design flexibility. comprising the cured product according to claim 10.

The invention claimed is:

1. A negative acting photosensitive resin composition comprising:

(A) a liquid compound having a triazine ring represented by the following formula (1):

(1)

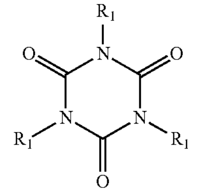

wherein each $R_1$ independently represents an organic group represented by the following formula (1-1);

(1-1)

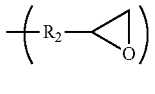

wherein $R_2$ is an n-propylene group;

(B) an epoxy resin, the epoxy resin being solid at room temperature and having a benzene backbone and at least two epoxy groups in one molecule and having an epoxy equivalent weight of 500 g/eq or less; and (C) a cationic photopolymerization initiator, the negative acting photosensitive resin composition having a content of the liquid compound (A) represented by formula (1) relative to the solid epoxy resin (B) of 3 to 20 mass % and having a ratio of the solid epoxy resin (B) to the liquid compound (A) represented by formula (1) of from 5 to 33.3, wherein the solid epoxy resin (B) satisfies at least one of the following conditions (i) and (ii):

condition (i): having a weight-average molecular weight of 500 or more; and condition (ii): having a softening point of 40° C. or more, and wherein the solid epoxy resin (B) having a benzene backbone and at least two epoxy groups in one molecule and having an epoxy equivalent weight of 500 g/eq or less comprises a combination of:

an epoxy resin (B-1) represented by the following formula (2):

(2)

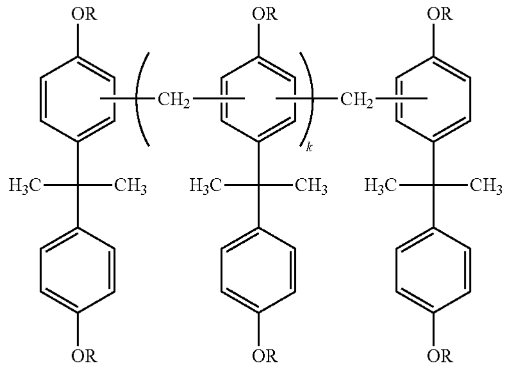

wherein the R groups each independently represent a glycidyl group or a hydrogen atom, with the proviso that at least two R groups are glycidyl groups, and k represents an average and is within a range of 0 to 30, an epoxy resin (B-2) represented by the following formula (3):

(3)

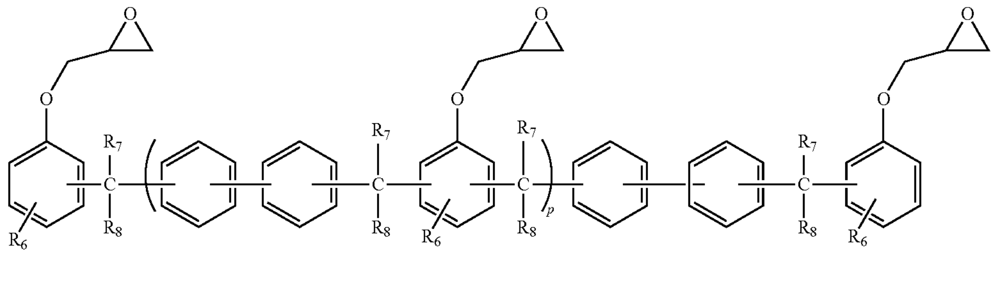

wherein $R_6$, $R_7$, and Rs each independently represent a hydrogen atom or a $C_{1-4}$ alkyl group, and p represents an average and is within a range of 1 to 30, and an epoxy resin (B-3) represented by the following formula (4):

(4)

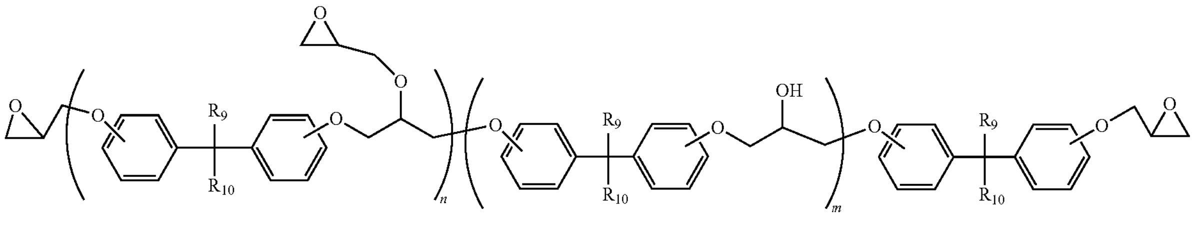

wherein n and m each represent an average, n is within a range of 1 to 30, m is within a range of 0.1 to 30, and Ry and $R_{10}$ each independently represent a hydrogen atom, a $C_{1-4}$ alkyl group, or a trifluoromethyl group, and wherein the negative acting photosensitive resin composition comprises a solvent other than the liquid compound (A) represented by formula (1), the solvent being contained in the composition in an amount of from 10 mass % to 90 mass % at a time when the composition is applied to a substrate, based on the total amount of the composition, said amount being effective to adjust a thickness and coating operability of a film to be formed from said composition while maintaining solubility and volatility of components contained in the composition and while maintaining liquid viscosity of the composition when the composition is applied to a substrate, said solvent being the only solvent other than the liquid compound (A) represented by formula (1) in the composition.

2. The negative acting photosensitive resin composition according to claim 1, wherein the solid epoxy resin (B) having a benzene backbone and at least two epoxy groups in one molecule and having an epoxy equivalent weight of 500 g/eq or less further comprises at least one member selected from the group consisting of:

an epoxy resin (B-4) represented by the following formula (5):

(5)

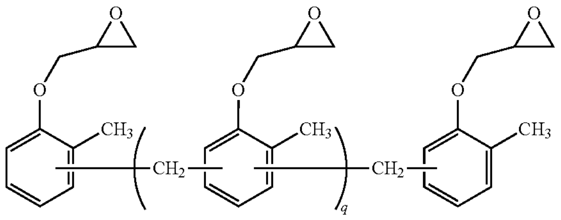

wherein q represents an average and is a real number within a range of 1 to 30, an epoxy resin (B-5) that is a reaction product between a phenol derivative represented by the following formula (6):

(6)

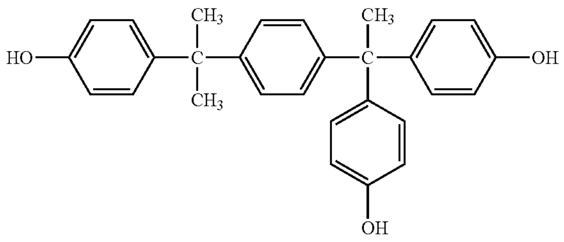

and an epihalohydrin, an epoxy resin (B-6) obtained by allowing a polybasic acid anhydride to react with a reaction product between an epoxy compound having at least two epoxy groups in one molecule and a compound having at least one hydroxyl group and one carboxyl group in one molecule, an epoxy resin (B-7) represented by the following formula (7):

(7)

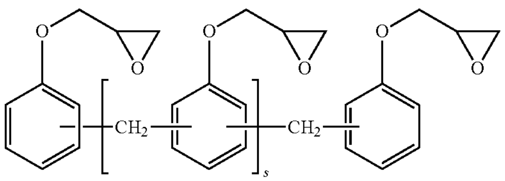

wherein s represents an average and is a real number within a range of 1 to 10, an epoxy resin (B-8) represented by the following formula (8):

(8)

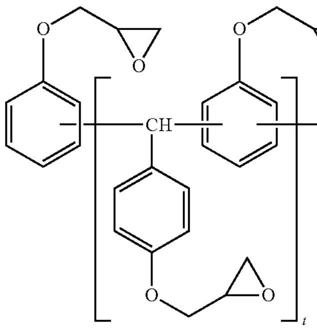

wherein t represents an average and is a real number within a range of 0.1 to 5, and an epoxy resin (B-9) represented by the following formula (9):

(9)

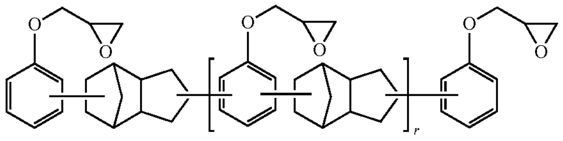

wherein r represents an average and is a real number within a range of 0.1 to 6.

3. A dry film resist comprising the negative acting photosensitive resin composition according to claim 1.

4. A cured product of the negative acting photosensitive resin composition according to claim 1.

5. A wafer level package comprising the cured product according to claim 4.

6. An adhesive layer between a substrate and an adherend, comprising the cured product according to claim 4.

7. A cured product of the dry film resist according to claim 3.

8. A wafer level package comprising the cured product according to claim 7.

9. An adhesive layer between a substrate and an adherend, comprising the cured product according to claim 7.

10. The negative acting photosensitive resin composition of claim 1, wherein said solvent comprises at least one selected from the group consisting of acetone, methyl ethyl ketone, cyclohexanone, cyclopentanone, toluene, xylene, tetramethyl benzene, ethylene glycol dimethyl ether, dipropylene glycol dimethyl ether, dipropylene glycol diethyl ether, ethyl acetate, butyl acetate, butyl cellosolve acetate, carbitol acetate, propylene glycol monomethyl ether acetate, γ-butyrolactone, methanol, ethanol, cellosolve, methyl cellosolve, octane, decane, petroleum ether, petroleum naphtha, hydrogenated petroleum naphtha, solvent naphtha, and combinations thereof.

* * * * *